(12) United States Patent
Tsai et al.

(10) Patent No.: US 6,183,819 B1
(45) Date of Patent: *Feb. 6, 2001

(54) METHOD FOR PROCESSING A POLY DEFECT

(75) Inventors: Chen-Chih Tsai; Yung-Hui Feng, both of Hsinchu (TW)

(73) Assignee: United Semiconductor Corp., Hsinchu (TW)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/241,528

(22) Filed: Feb. 1, 1999

(30) Foreign Application Priority Data

Jan. 4, 1999 (TW) .................................................. 88100009

(51) Int. Cl.$^7$ .............................. C23C 16/40; H05H 1/24
(52) U.S. Cl. ....................... 427/579; 427/255.7; 427/240; 438/680; 438/692; 438/699; 438/723
(58) Field of Search .................................... 427/578, 579, 427/255.7, 240; 438/699, 723, 680, 692

(56) References Cited

U.S. PATENT DOCUMENTS

| 4,616,404 | * | 10/1986 | Wang et al. | 438/532 |
|---|---|---|---|---|
| 4,981,811 | * | 1/1991 | Feygenson et al. | 438/684 |
| 5,336,365 | * | 8/1994 | Goda et al. | 156/643 |
| 5,677,204 | * | 10/1997 | Imai et al. | 438/17 |
| 5,837,595 | * | 11/1998 | Ahn et al. | 438/443 |
| 5,963,818 | * | 11/1998 | Kao et al. | 438/424 |

\* cited by examiner

*Primary Examiner*—Shrive Beck
*Assistant Examiner*—Bret Chen
(74) *Attorney, Agent, or Firm*—Jiawei Huang; J.C. Patents

(57) ABSTRACT

A method for processing a poly defect is described. A substrate is provided, and a first oxide layer is formed on the substrate. A polysilicon layer is formed on the first oxide layer, and a poly defect is formed on the polysilicon layer surface simultaneous with polysilicon layer formation. A second oxide layer is formed conformal to the substrate, a portion of the second oxide layer and the poly defect are removed by polishing until a thin second oxide layer and a thin poly defect layer are formed. Finally, the thin second oxide layer is removed.

9 Claims, 3 Drawing Sheets

METHOD FOR PROCESSING A POLY DEFECT

CROSS-REFERENCE TO RELATED APPLICATION

This application claims the priority benefit of Taiwan application serial no. 88100009, filed Jan. 4, 1999, the full disclosure of which is incorporated herein by reference.

BACKGROUND OF THE INVENTION

1. Field of the Invention

The present invention relates to a method for a semiconductor device fabrication. More particularly, the present invention relates to a method for processing a poly defect.

2. Description of the Related Art

In semiconductor manufacturing process, polysilicon is widely used to form a conductive layer, especially a gate conductive layer. However, defects are often formed on a polysilicon layer, called poly defects, while forming the polysilicon layer. The poly defects usually affect the subsequent photolithography and etching process, so that the device yield is decreased because of the poly defects. The defects are mostly formed by impurities left in a chamber used for forming the polysilicon layer. Most of the impurities are polysilicon particles left by the process for forming the polysilicon layer. When the reaction temperature is high or the concentration of the silicon source gas is high, the polysilicon particles are easily formed and adsorbed on the wall of the chamber. When too many polysilicon particles have been adsorbed, the polysilicon particles fall on chips and pollute them. The problem of impurities is avoided by cleaning the chamber, but the cleaning process takes one and a half to two days. Therefore, the throughput of devices is decreased when the reaction chamber is idle.

Conventionally, the poly defects are removed by a scrubber or a sprayer. However, the scrubber or sprayer generates stress, so that a recess or vacancy is generated and the oxide layer formed in the previous process is exposed. This recess or vacancy causes leakage current and open circuit or short circuit generation to result in the failure of the whole chip.

FIGS. 1A through 1B are schematic, cross-sectional views showing the conventional processing steps for removing a poly defect. Referring to FIG. 1A, a substrate 10 is provided, and an oxide layer 12 including a gate oxide layer and a field oxide layer is formed on the substrate 10. A polysilicon layer 14 is formed on the oxide layer 12. A poly defect 16 is formed on the polysilicon layer 14 surface simultaneous with the formation of the polysilicon layer 14. The height of the poly defect 16 is about 0.5–3 micrometer.

Referring to FIG. 1B, the poly defect 16 is removed by scrubber or sprayer. The scrubber or sprayer generates stress, so that a recess or vacancy 18 is generated and the oxide layer 12 formed in the previous process is exposed. Therefore, the poly defect 16 causes a leakage current and an open circuit or a short circuit which result in the failure of the whole chip. The effect of removing the poly defect 16 by scrubber or sprayer is limited.

SUMMARY OF THE INVENTION

Accordingly, the purpose of the present invention is to provide a method for removing a poly defect. The method can effectively process the poly defect and avoid creating a recess or vacancy on the polysilicon layer.

Another object of the present invention is to provide a method for processing a poly defect. The method does not affect the previous structure and can increase yield to reduce capital expenditure.

To achieve these and other advantages and in accordance with the purpose of the invention, as embodied and broadly described herein, the invention provides a method for removing a poly defect. A substrate is provided, and a first oxide layer is formed on the substrate. A polysilicon layer is formed on the first oxide layer. A poly defect is formed on the polysilicon layer surface simultaneous with polysilicon layer formation. A second oxide layer is formed conformal to the substrate, the second oxide layer and the poly defect are removed by polishing until a thin second oxide layer and a thin poly defect are left. Finally, the thin second oxide layer is removed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
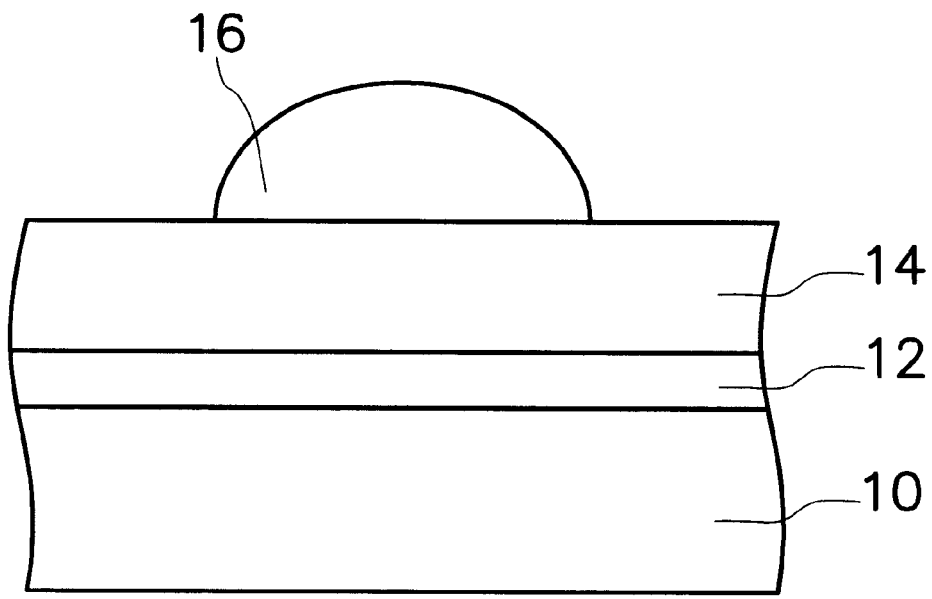
FIGS. 1A through 1B are schematic, cross-sectional views showing the conventional processing steps for removing a poly defect.
Figure 1B:
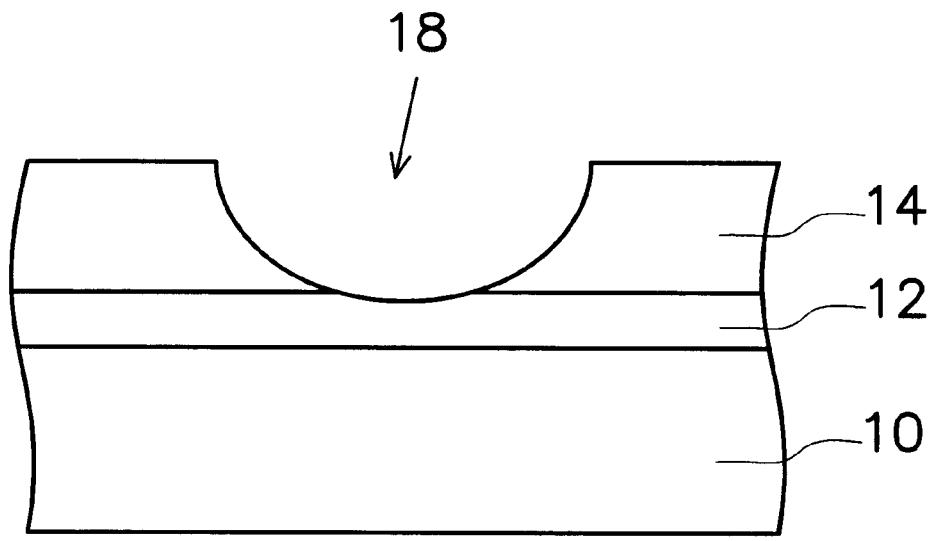

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2D are schematic, cross-sectional views showing the processing steps for removing a poly defect according to the preferred embodiment of this invention.

Figure 2A:
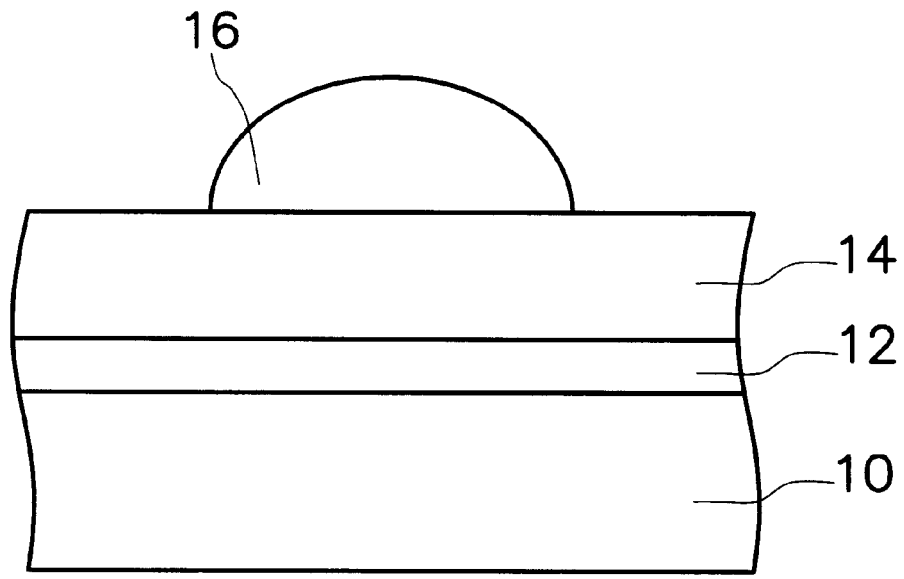
FIGS. 2A through 2D are schematic, cross-sectional views showing the processing steps for removing a poly defect according to the preferred embodiment of this invention.

Referring to FIG. 2A, a substrate 10 having a first oxide layer 12, such as a gate oxide layer and a field oxide layer, is provided. A polysilicon layer 14 is formed, for example, by low pressure chemical vapor deposition (LPCVD) on the first oxide layer 12. A poly defect 16 is formed on the polysilicon layer 14 surface simultaneous with the formation of the polysilicon layer 14. The height of the poly defect 16 is about 0.5–3 micrometer.

Figure 2B:
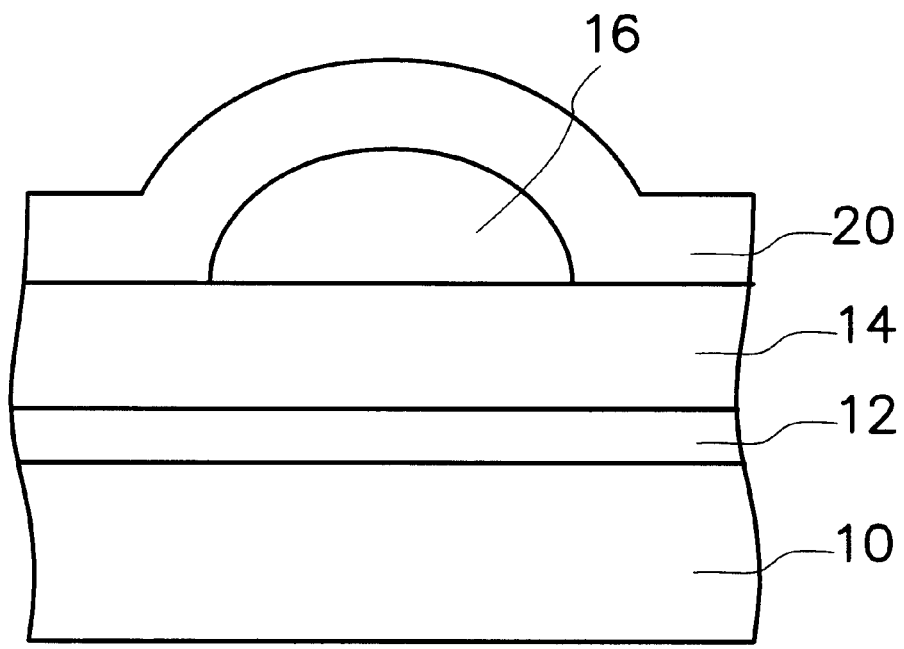

Referring to FIG. 2B, a second oxide layer 20 is formed, for example, by spin-on glass (SOG) coating or plasma enhanced chemical vapor deposition (PECVD), such that the second oxide layer 20 is conformal to the substrate 10. The thickness of the second oxide layer 20, such as a SOG oxide layer or a plasma oxide layer, is about 1000–3000 Å, so as to cover the poly defect 16.

Figure 2C:
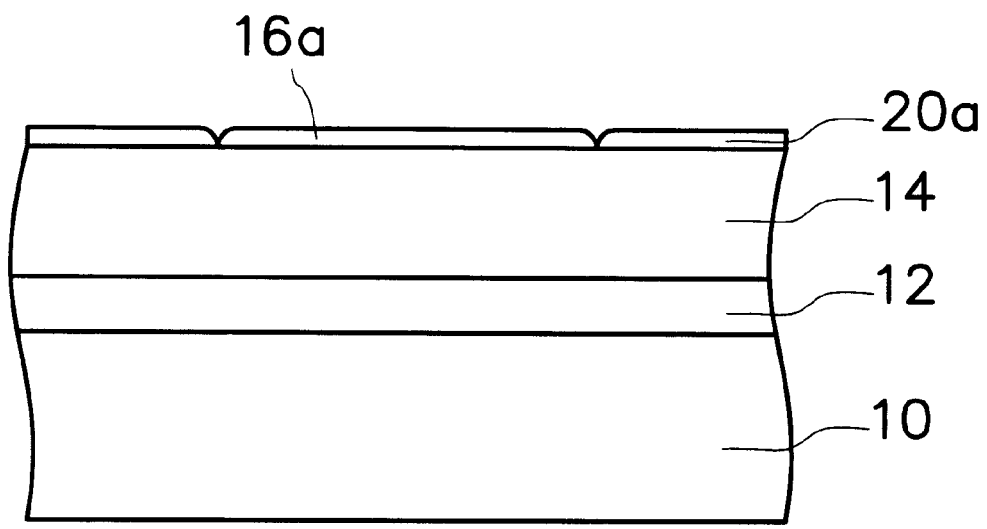

Referring to FIG. 2C, a portion of the second oxide layer 20 and the poly defect 16 are removed, for example, by chemical mechanical polishing (CMP) until a thin second oxide layer 20a and a thin poly defect 16a are left. The thicknesses of the thin second oxide layer 20a and the thin poly defect 16a are about 100–500 Å.

Figure 2D:
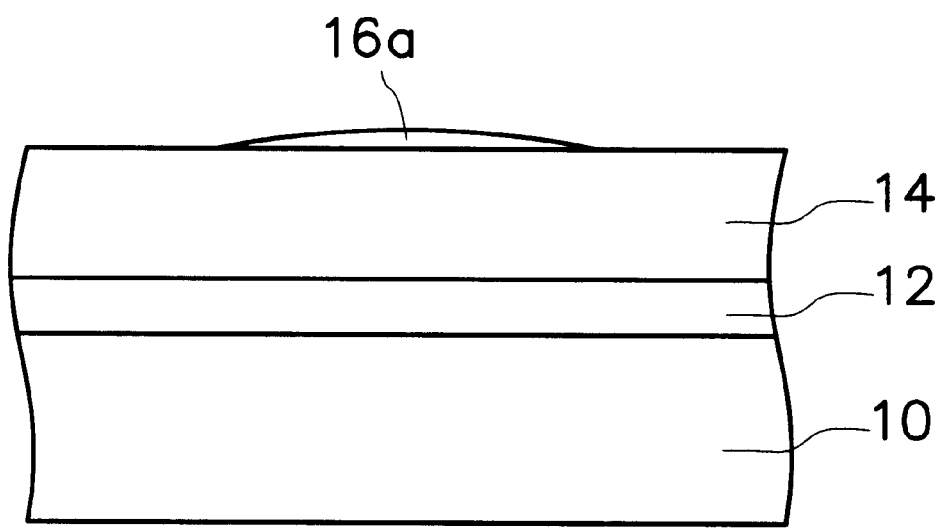

Referring to FIG. 2D, the thin second oxide layer 20a is removed, for example, by selective etching such as wet etching to expose the polysilicon layer 14. The wet etching process is performed, for example, using a hydrogen fluoride (HF) solution as an etchant.

In conclusion, the method according to the present invention is to provide a method for processing a poly defect. The method can effectively remove the poly defect and avoid the recess or vacancy generated on the polysilicon layer. In addition, the method does not affect the previous structure and can increase yield to reduce capital expenditure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for processing a poly defect, wherein a substrate having a first oxide layer is provided, a polysilicon layer is formed on the oxide layer, and a poly defect is formed on the polysilicon layer surface during polysilicon layer formation, the method comprising the steps of:

forming a second oxide layer to cover the poly defect and conformal to the poly defect;

polishing a portion of the second oxide layer and the poly defect until a thin second oxide layer and a thin poly defect layer are left, wherein the poly defect is surrounded by the second oxide layer; and removing the thin second oxide layer, so as to expose the polysilicon layer.

2. The method of claim 1, wherein the step of forming the oxide layer the second oxide layer includes coating a spin-on glass layer.

3. The method of claim 1, wherein the step of forming the second oxide layer includes using plasma enhanced chemical vapor deposition.

4. The method of claim 1, wherein the second oxide layer thickness is about 1000–3000 Å.

5. The method of claim 1, wherein the step of processing the second oxide layer and the poly defect includes using chemical mechanical polishing.

6. The method of claim 1, wherein both the thin second oxide layer and the thin poly defect layer has a thickness of about 100–500 Å.

7. The method of claim 1, wherein the step of removing the thin second oxide layer includes using selective etching.

8. The method of claim 7, wherein the selective etching includes wet etching.

9. The method of claim 8, wherein the wet etching includes using hydrogen fluoride solution as an etchant.

* * * * *